(12) United States Patent
Goutaudier et al.

(10) Patent No.: US 10,593,588 B2
(45) Date of Patent: Mar. 17, 2020

(54) ELECTRONIC CIRCUIT COMPRISING ELECTRICALLY INSULATING TRENCHES

(71) Applicants: Aledia, Grenoble (FR); Commissariat à l'Énergie Atomique et aux Énergies Alternatives, Paris (FR)

(72) Inventors: Fabienne Goutaudier, Grenoble (FR); Thomas Lacave, Grenoble (FR); Vincent Beix, Fontaine (FR); Stephan Borel, Crolles (FR); Bertrand Chambion, Pontcharra (FR); Brigitte Soulier, Grenoble (FR)

(73) Assignees: Aledia, Grenoble (FR); Commissariat à l'Énergie Atomique et aux Énergies Alternatives, Paris (FR)

( * ) Notice: Subject to any disclaimer, the term of this patent is extended or adjusted under 35 U.S.C. 154(b) by 0 days.

(21) Appl. No.: 16/061,648

(22) PCT Filed: Dec. 21, 2016

(86) PCT No.: PCT/FR2016/053618
§ 371 (c)(1),
(2) Date: Jun. 12, 2018

(87) PCT Pub. No.: WO2017/109415
PCT Pub. Date: Jun. 29, 2017

(65) Prior Publication Data
US 2018/0366365 A1 Dec. 20, 2018

(30) Foreign Application Priority Data
Dec. 24, 2015 (FR) ...................................... 15 63330

(51) Int. Cl.
*H01L 21/762* (2006.01)
*H01L 27/144* (2006.01)
(Continued)

(52) U.S. Cl.
CPC .. *H01L 21/76224* (2013.01); *H01L 21/02532* (2013.01); *H01L 27/1446* (2013.01);
(Continued)

(58) Field of Classification Search
CPC ......... H01L 21/76224; H01L 21/02532; H01L 27/1446; H01L 27/156; H01L 33/08; H01L 33/18; H01L 2924/0002; H01L 29/7813
See application file for complete search history.

(56) References Cited

U.S. PATENT DOCUMENTS 5,448,102 A    9/1995  Gaul et al.
5,683,075 A *  11/1997  Gaul ..................... H01L 21/762
                                                          257/510
(Continued)

OTHER PUBLICATIONS

International Search Report for Application No. PCT/FR2016/053618 dated Mar. 24, 2017.
(Continued)

*Primary Examiner* — Frederick B Hargrove
*Assistant Examiner* — Patricia D Reddington
(74) *Attorney, Agent, or Firm* — Wolf, Greenfield & Sacks, P.C.

(57) ABSTRACT

An electronic circuit including a semiconducting or conducting substrate having first and second opposite surfaces and at least first and second non-parallel electrically insulating trenches that extend from the first surface in the substrate, define at least one portion of the substrate and join at a junction, the portion of the substrate including a protrusion that extends to the junction.

8 Claims, 4 Drawing Sheets

(51) Int. Cl.
*H01L 27/15* (2006.01)
*H01L 33/08* (2010.01)
*H01L 33/18* (2010.01)
*H01L 21/02* (2006.01)
*H01L 29/78* (2006.01)

(52) U.S. Cl.
CPC ............ *H01L 27/156* (2013.01); *H01L 33/08* (2013.01); *H01L 33/18* (2013.01); *H01L 29/7813* (2013.01); *H01L 2924/0002* (2013.01)

(56) References Cited

U.S. PATENT DOCUMENTS

2009/0294893 A1* 12/2009 Lerner .............. H01L 21/76224
257/506
2011/0049668 A1 3/2011 Lin et al.
2012/0098084 A1 4/2012 Lerner et al.
2015/0118823 A1 4/2015 Nier et al.

OTHER PUBLICATIONS

Written Opinion for Application No. PCT/FR2016/053618 dated Mar. 24, 2017.

* cited by examiner

ELECTRONIC CIRCUIT COMPRISING ELECTRICALLY INSULATING TRENCHES

CROSS-REFERENCE TO RELATED APPLICATIONS

This Application is a national stage filing under 35 U.S.C. 371 of International Patent Application Serial No. PCT/FR2016/053618, filed Dec. 21, 2016, which claims priority to French application number 1563330, filed Dec. 24, 2015. The entire contents of these applications are incorporated herein by reference in their entirety.

BACKGROUND

The present application concerns an electronic circuit comprising electric insulation trenches.

DISCUSSION OF THE RELATED ART

Generally, an electronic circuit comprises a conductive or semiconductor substrate having electronic components formed inside and on top of it. For certain applications, it is desirable to electrically insulate different portions of the substrate from one another. This can be obtained by forming in the substrate electrically-insulating trenches which extend across the entire thickness of the substrate and which divide the substrate into portions electrically insulated from one another.

FIG. 1 is a partial simplified top view of an example of an electronic circuit 5 and FIG. 2 is a cross-section view of FIG. 1 along line II-II. Electronic circuit 5 comprises a semiconductor or conductive substrate 6 having opposite faces 8, 10 and further comprises, in substrate 6, electric insulation trenches 12, 14 which cross and delimit portions 16 of substrate 6. Trenches 12 extend in top view along a first direction and trenches 14 extend in top view along a second direction inclined with respect to the first direction, for example perpendicular to the first direction. Trenches 12, 14 have substantially the shape of strips in top view. Trenches 12, 14 extend in substrate 6 from face 8 across a portion of or the entire thickness of substrate 6.

As an example, each trench 12, 14 comprises two substantially planar opposite lateral walls 17, for example, substantially parallel, covered with an electrically-insulating layer 18 of thickness Eox, core 20 of trench 12, 14 being filled with a filling material, for example, a semiconductor material. As a variation, each trench 12, 14 may be totally filled with an electrically-insulating material. The width E of each trench 12, 14 corresponds to the distance between two opposite walls 17 of the trench.

At each intersection 22 between one of trenches 12 and one of trenches 14, the lateral walls 17 of trench 12 are substantially perpendicular to the lateral walls 17 of trench 14. A disadvantage of such an electronic circuit 5 is that intersections 22 are stress concentration areas, so that cracks tend to form in the substrate at these locations. More specifically, the stress concentration areas are located at each edge 24 between lateral walls 17 of trench 12 and lateral walls 17 of trench 14.

FIG. 3 is a partial simplified top view of another example of an electronic circuit 25 which comprises the assembly of the elements of electronic circuit 5 shown in FIG. 1, with the difference that, for each intersection 22, each edge 24 of intersection 22 is replaced with a rounded junction area 26, insulating layer 18 following the shape of rounded area 26. Thereby, each trench 12, 14 is flared at the level of intersection 22. Rounded areas 26 enable to decrease, or even to suppress the stress concentration areas.

A disadvantage of electronic circuit 5 and 25 is that the maximum width EMAX at intersection 22 is greater than width E of each trench 12, 14 outside of intersection 22. The phenomenon is more strongly marked for electronic circuit 25 with the presence of rounded areas 26 diametrically opposite with respect to the center of intersection 22. As an example, for a width E of approximately 2 µm, maximum width EMAX may be approximately 2.8 µm. The filling of core 20 of trenches 12, 14 may then be difficult to implement. Indeed, when the filling of the core of trenches 12, 14 is performed by conformal deposition of the filling material over the entire electronic circuit 5, the deposited thickness should be that which enables to fill core 20 of trenches 12, 14 at width EMAX, that is, greater than the thickness enabling to fill core 20 of trenches 12, 14 at width E. This may cause the forming of overthicknesses of the filling material on the electronic circuit, which may be difficult to remove.

Another disadvantage of electronic circuit 25 is that rounded areas 26 cause a decrease in the surface area of the semiconductor or conductive portions 16 used to form electronic components.

SUMMARY

An object of an embodiment is to overcome all or part of the disadvantages of previously-described electronic circuits.

Another object of an embodiment is to decrease the maximum intensity of the stress at the intersections between the electric insulation trenches.

Another object of an embodiment is for the maximum width of the intersections between the electric insulation trenches not to be greater than the width of the electric insulation trenches outside of the intersections.

Another objet of an embodiment is for the surface area, in top view, of the substrate portions delimited by the electric insulation trenches not to be decreased with respect to the surface area of portions delimited by electric insulation trenches crossing at 90°.

Another object of an embodiment is for the electric insulation trench filling method not to be modified with respect to the method implemented in the case of electric insulation trenches crossing at 90°.

Another object of an embodiment is for the method of removal of the excess trench filling material, for example, by wet, dry etching, or by chem.-mech. planarization (CMP), not to be modified with respect to the case where the trenches cross at 90°, to avoid adding additional processing time to the manufacturing method.

Thus, an embodiment provides an electronic circuit comprising a semiconductor or conductive substrate having first and second opposite faces and at least first and second electric insulation trenches, not parallel, extending in the substrate from the first face, delimiting at least a portion of the substrate and joining at a junction, the portion of the substrate comprising a protrusion penetrating into the junction.

According to an embodiment, the first trench comprises, on the side of said portion, a first planar wall. The second trench comprises, on the side of said portion, a second planar wall, the first planar wall being coupled to the second planar wall by a connection surface successively comprising, from the first wall to the second wall, a first curved surface delimiting a portion of convex volume of the first trench, a second curved surface delimiting a portion of concave volume of the junction, and a third curved surface delimiting a portion of convex volume of the second trench.

According to an embodiment, the radius of curvature of the second surface is in the range from 200 nm to 2 µm.

According to an embodiment, the first, second, and third surfaces correspond, in a plane parallel to the first face, respectively to first, second, and third arcs of a circle.

According to an embodiment, the center of the first arc of a circle is located in the first trench, the center of the second arc of a circle is located in the portion, and the center of the third arc of a circle is located in the second trench.

According to an embodiment, said junction corresponds to an intersection between the first and second trenches, the first trench having a cross-section of decreased width on either side of the intersection and the second trench having a cross-section of decreased width on either side of the intersection.

According to an embodiment, the connection surface is repeated at the four corners of the intersection.

According to an embodiment, the walls of the first and second trenches are covered with a layer of a first electrically insulating material, the core of the first and second trenches being filled with a second material which may be different from the first material.

According to an embodiment, the interface between the insulating layer and the core successively comprises fourth, fifth, and sixth surfaces which respectively take the shape of the first, second, and third surfaces.

According to an embodiment, the radius of curvature of the fourth surface and of the sixth surface is in the range from 100 nm to 1 µm.

BRIEF DESCRIPTION OF THE DRAWINGS

The foregoing and other features and advantages will be discussed in detail in the following non-limiting description of specific embodiments in connection with the accompanying drawings, among which.

DETAILED DESCRIPTION

Figure 1:
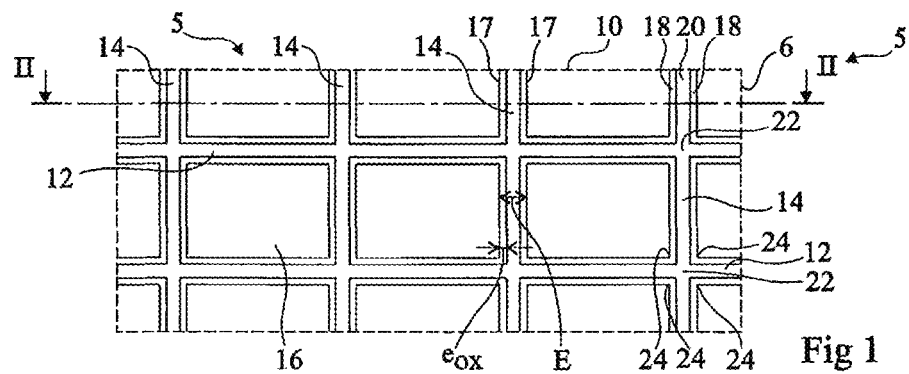
FIGS. 1, 2, and 3, previously described, are partial simplified views of examples of electronic circuits comprising electric insulation trenches.
Figure 2:
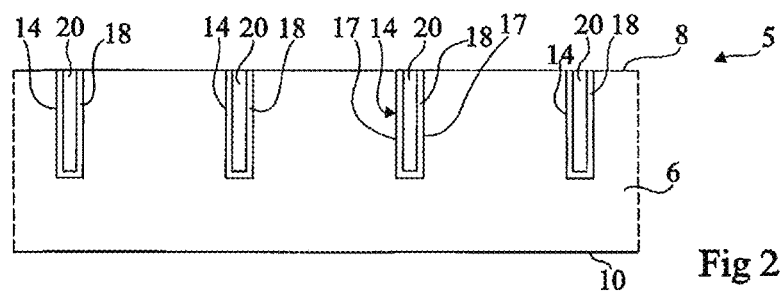

The same elements have been designated with the same reference numerals in the different drawings. For clarity, only those elements which are useful to the understanding of the described embodiments have been shown and are detailed. In the following description, when reference is made to terms qualifying absolute positions, such as terms "front", "back", "top", "bottom", "left", "right", etc., or relative positions, such as terms "above", "under", "upper", "lower", etc., or to terms qualifying directions, such as terms "horizontal", "vertical", etc., it is referred to the orientation of the drawings. The terms "approximately", "substantially", and "in the order of" are used herein to designate a tolerance of plus or minus 10%, preferably of plus or minus 5%, of the value in question. In the following description, a material having a resistivity greater than 105 Ω·m is called "electrically-insulating material", a material having an electric resistivity in the range from 0.1 Ω·m to 103 Ω·m is called "semiconductor material", and a material having an electric resistivity smaller than 10−3 Ω·m is called "conductive material".

Figure 3:
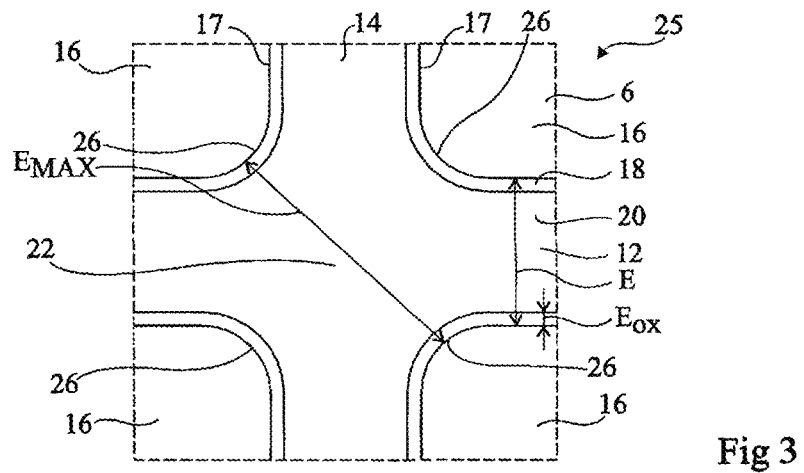
Figure 4:
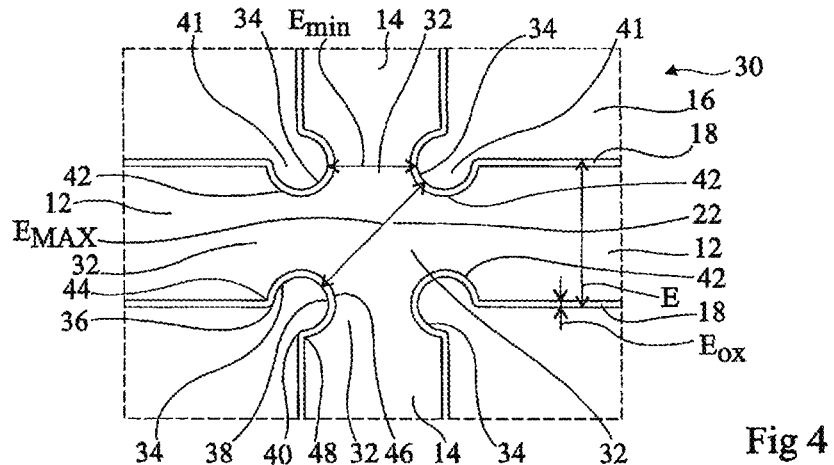
FIG. 4 is a partial simplified top view of an embodiment of an electronic circuit comprising electric insulation trenches.

FIG. 4 is a view similar to FIG. 3 and shows an embodiment of an electronic circuit 30. Electronic circuit 30 comprises all the elements of electronic circuit 25 shown in FIG. 3, with the difference that, for each intersection 22, instead of being flared, each trench 12, 14 comprises a throat area 32 on either side of intersection 22. Thereby, for each intersection 22, there are four throat areas 32. Call Emin the minimum width of trench 12, 14 at the level of throat area 32. Two throat areas 32 are located on trench 12 on either side of intersection 22 and two throat areas 32 are located on trench 14 on either side of intersection 22. Each throat area 32 is delimited by two surfaces 34, called ears hereafter, which penetrate into trench 12, 14 and which are located at each junction of a lateral wall 17 of trench 12 with a lateral wall 17 of trench 14.

According to an embodiment, each ear 34 successively comprises, from planar wall 17 of trench 12 to planar wall 17 of trench 14, a first curved surface 36, a second curved surface 38, and a third curved surface 40. The first curved surface 36 delimits a portion of convex volume of trench 12. A volume is convex if, for all points A and B of the volume, all the points of segment [AB] belong to the volume. According to an embodiment, in the cross-section plane of FIG. 4, the cross-section of the first curved surface 36 corresponds to an arc of a circle having its center inside of trench 12. The second curved surface 38 delimits a portion of concave volume, that is, non convex, of intersection 22. According to an embodiment, in the cross-section plane of FIG. 4, the cross-section of second curved surface 38 corresponds to an arc of a circle having its center outside of trenches 12, 14. The third curved surface 40 delimits a convex volume portion of trench 14. According to an embodiment, in the cross-section plane of FIG. 4, the cross-section of third curved surface 40 corresponds to an arc of a circle having its center inside of trench 14. Each portion 16 thus comprises a protrusion 41 which penetrates into trenches 12, 14 at intersection 22.

When insulating trench 18 is present, interface 42, which separates insulating layer 18 from core 20 of trenches 12, 14, takes the shape of ear 34, that is, it successively comprises a curved surface 44 which takes the shape of curved surface 36, a curved surface 46 which takes the shape of curved surface 38, and a curved surface 48 which takes the shape of curved surface 40. Call ear exit radius rear_exit the radius of curvature of surface 44 or 48 and call ear radius rear the radius of curvature of surface 38. Radius rear is selected to obtain the desired width EMAX. Preferably, width EMAX is in the order of width E of trenches 12, 14. Radius rear_exit is selected according to the maximum intensity of the stress desired in electronic circuit 30.

According to an embodiment, radius rear_exit is in the range from 100 nm to 500 nm, preferably from 200 nm to 400 nm, for example, approximately 300 nm. According to an embodiment, radius rear is in the range from 200 nm to 2 µm, preferably from 200 nm to 600 nm, more preferably from 300 nm to 500 nm, for example, approximately 400 nm. Width E of each trench 12, 14 is in the range from 0.5 µm to 10 µm, for example, approximately 2 µm. Thickness Eox of insulating layer 18 is in the range from 10 nm to 500 nm, preferably from 100 nm to 400 nm, for example, approximately 200 nm. The depth of trenches 12, 14 depends on the envisaged application and on width E of the trenches. As an example, the depth of trenches 12, 14 is in the range from 2 µm to 150 µm and the "trench depth/trench width" aspect ratio can thus be in the range from 1 to 40, for example, 25.

Figure 5:
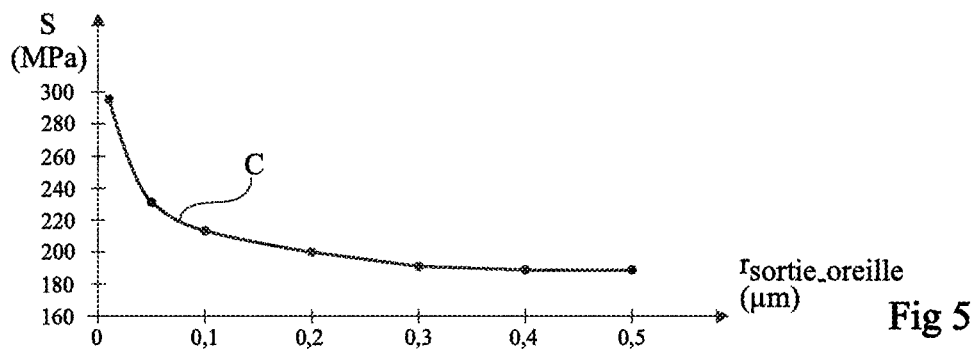
FIG. 5 shows curve C of the variation of the maximum stress in the electronic circuit shown in FIG. 4 according to the radius of curvature of the insulating layer of the electric insulation trench at the intersection between two electric insulation trenches.

FIG. 5 shows curve C of variation of the maximum intensity of the equivalent Von Mises stress S in electronic circuit 30 according to ratio rear_exit. The case where radius rear_exit is substantially equal to 0 corresponds to the case shown in FIG. 1. Curve C has been obtained for single-crystal silicon portions 16, a polysilicon core 20, an insulating layer 18 made of silicon oxide with a thickness Eox equal to 200 nm, trenches 12, 14 having a width E of 2 µm and a width Emin of 1.16 µm.

When radius rear_exit is greater than 100 nm, the maximum intensity of the equivalent Von Mises stress S is smaller than 215 MPa and when radius rear_exit is greater than 300 nm, the maximum intensity of the equivalent Von Mises stress S is smaller than 186 MPa. This equivalent Von Mises stress corresponds to a maximum main voltage stress of approximately 75 MPa. This value is smaller than the maximum voltage stress accepted by most materials used for electronic circuit manufacturing.

Figure 6:
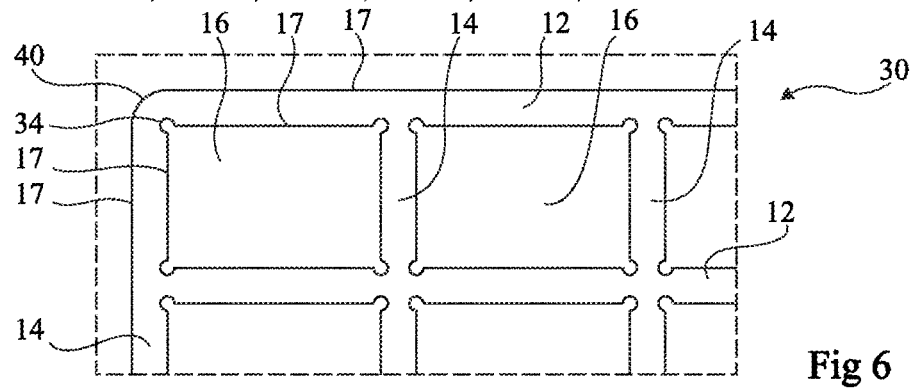
FIG. 6 is a partial simplified top view of an embodiment of an electronic circuit illustrating the junction between two electric insulation trenches in a corner of the circuit.

FIG. 6 is a partial simplified top view of electronic circuit 30 where a plurality of portions 16 of the semiconductor or conductive substrate having a portion located in the upper left-hand corner of electronic circuit 30 have been shown. In FIG. 6, insulating layer 18 and core 20 of trenches 12, 14 are not shown. In the present embodiment, for trenches 12, 14 located in at least one of the corners of electronic circuit 30, the junction between lateral walls 17 of trenches 12, 14 which are on the side of semiconductor or conductive portion 16 is formed by an ear 34 while the junction between the lateral walls 17 of trenches 12, 14 which are on the side opposite to portion 16 is formed by a rounded area 40. The radius of curvature of rounded area 40 may be substantially equal to radius of curvature rear_exit. In the cross-section plane of FIG. 6, the cross-section of rounded area 40 for example corresponds to an arc of a circle.

Figure 7:
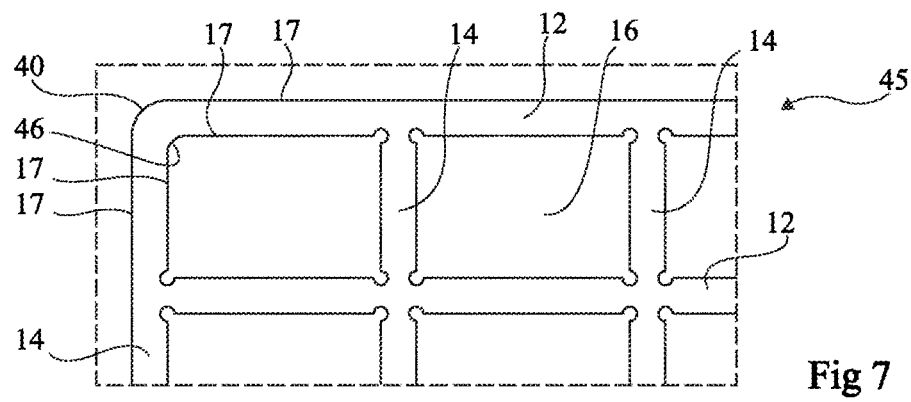
FIG. 7 is a partial simplified top view of another embodiment of an electronic circuit illustrating the junction between two electric insulation trenches in a corner of the circuit.

FIG. 7 is a top view similar to FIG. 6 of another embodiment of an electronic circuit 45. In FIG. 7, insulation layer 18 and core 20 of trenches 12, 14 are not shown. Electronic circuit 45 comprises all the elements of electronic circuit 30, with the difference that, for trenches 12, 14 located in at least one of the corners of electronic circuit 30, the junction between lateral walls 17 of trenches 12, 14 which are on the side of portion 16 is formed by a rounded area 46 corresponding, for example, to a cylindrical sector having its axis located in portion 16. In the cross-section plane of FIG. 7, the cross-section of rounded area 46 corresponds, for example, to an arc of a circle.

Figure 8:
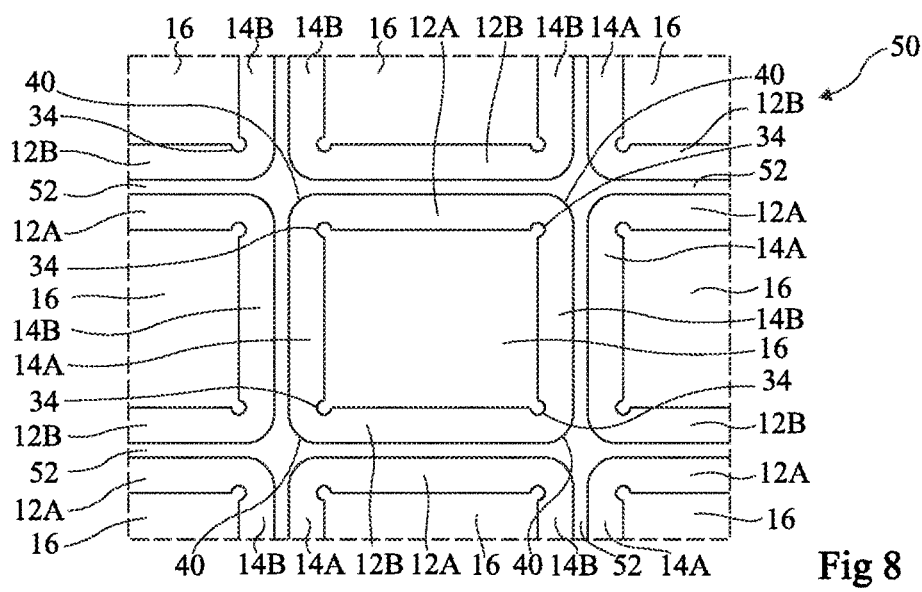
FIG. 8 is a partial simplified top view of another embodiment of an electronic circuit comprising electric insulation trenches.

FIG. 8 is a top view similar to FIG. 4 of another embodiment of an electronic circuit 50. In FIG. 8, insulation layer 18 and core 20 of trenches 12, 14 are not shown. The elements common with electronic circuit 30 are designated with the same reference numerals. In the present embodiment, two parallel trenches are arranged between semiconductor or conductive portions 16 of a couple of adjacent portions. Each portion 16 is thus surrounded with electric insulation trenches forming a frame comprising an upper trench 12A, a lower trench 12B, a lateral trench on the left-hand side 14A, and a lateral trench on the right-hand side 14B. Each trench 12A, 12B, 14A, 14B may have the previously-described structure of trench 12 or 14.

According to an embodiment, trenches 12A, 12B, 14A, 14B surrounding a semiconductor or conductive portion 16 are separated from trenches 12A, 12B, 14A, 14B surrounding an adjacent portion 16 with a strip 52 of substrate 6. For the lateral walls 17 of trenches 12A, 12B, 14A, 14B located on the side of portion 16, the junction between the lateral wall 17 of a trench 12A or 12B and the lateral wall 17 of a trench 14A or 14B is formed by an ear 34 while, for the lateral walls 17 of trenches 12A, 12B, 14A, 14B located on the side opposite to portion 16, the junction between the lateral wall 17 of a trench 12A or 12B and the lateral wall 17 of a trench 14A or 14B is formed by a rounded area 40.

FIGS. 9A to 9E illustrate a method of manufacturing electronic circuit 30 shown in FIG. 4. The same method may be implemented for the manufacturing of electronic circuits 45 and 50.

Figure 9A:
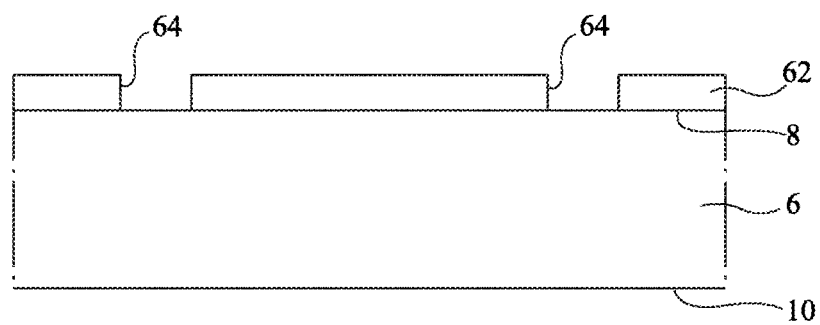
FIGS. 9A to 9E show the structures obtained at successive steps of an embodiment of a method of manufacturing the electronic circuit shown in FIG. 4.

FIG. 9A shows the structure obtained after having formed, on front face 8 of substrate 6, a layer 62 of a resist and after having formed by photolithography openings 64 in resist layer 62 at the desired locations of trenches 12, 14.

Substrate 6 may correspond to a monoblock structure or correspond to a layer covering a support made of another material. Substrate 6 is preferably a semiconductor substrate, for example, a substrate made of silicon, of germanium, of silicon carbide, of a III-V compound, such as GaN or GaAs, or a ZnO substrate. Preferably, substrate 6 is a single-crystal silicon substrate. Preferably, it is a semiconductor substrate compatible with manufacturing methods implemented in microelectronics. Substrate 6 may correspond to a multilayer structure of silicon-on-insulator type, also called SOI. Substrate 6 may be heavily doped, lightly-doped, or non-doped.

Figure 9B:
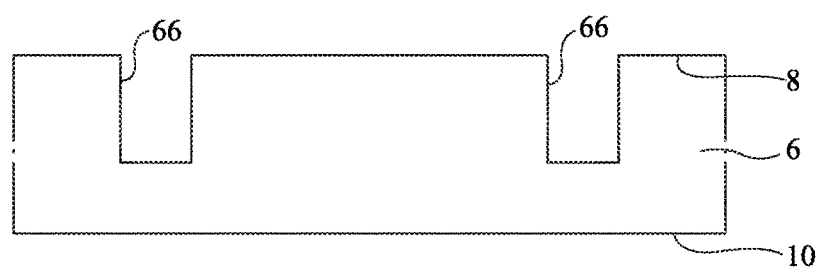

FIG. 9B shows the structure obtained after having etched openings 66 in substrate 6, for example, by a deep dry etching, in the extension of openings 64 and after having removed resin layer 62.

According to a variation, a hard mask may be used. To achieve this, a layer of a material, preferably dielectric, may be deposited on face 8 of substrate 6 before the deposition of resin layer 62, first openings being etched in the hard mask in the extension of openings 64 and second openings being etched in substrate 6 in the extension of the first openings.

Figure 9C:
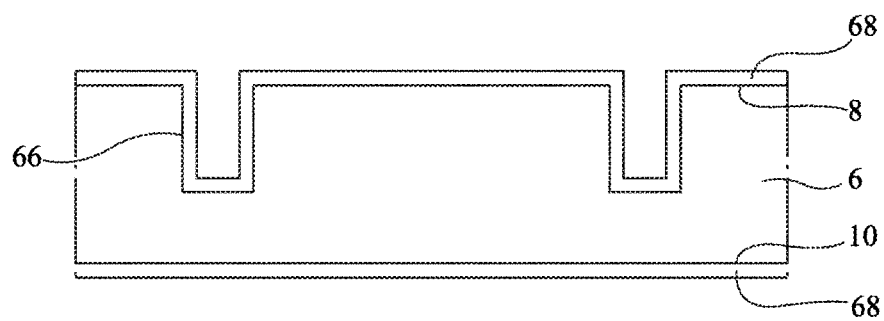

FIG. 9C shows the structure obtained after having formed an electrically-insulating layer 68 over the entire substrate 6 and, particularly, in openings 66. Insulating layer 68 may be made of a dielectric material, for example, of silicon oxide ($SiO_2$), of silicon nitride ($Si_xN_y$, where x is approximately equal to 3 and y is approximately equal to 4, for example, $Si_3N_4$), of silicon oxynitride (particularly of general formula $SiO_xN_y$, for example, $Si_2ON_2$), or of hafnium oxide (HfO2). Insulating layer 68 may have a monolayer structure or may correspond to a stack of two layers or of more than two layers. According to the method implemented to form insulating layer 68, the latter may also be formed on the back side of substrate 6.

According to an embodiment, insulating layer 68 is obtained by a thermal oxidation step. As a variation, insulating layer 68 may be formed by a method of chemical vapor deposition type (CVD), particularly plasma-enhanced chemical vapor deposition (PECVD).

Figure 9D:
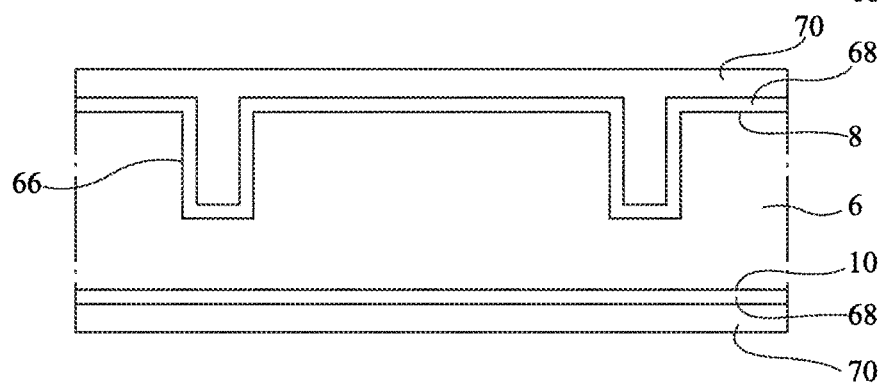

FIG. 9D shows the structure obtained after having deposited a layer 70 of a filling material over the entire substrate 6 and, particularly, in openings 66. The thickness of layer 70 is selected so that the openings 66 covered with insulating layer 68 are partially or totally filled with the filling material. The filling material may correspond to the material forming substrate 6, particularly in polycrystalline form, or may be another material than that forming the substrate. As an example, the filling material is polysilicon, doped or not. Layer 70 may be formed by CVD.

Figure 9E:
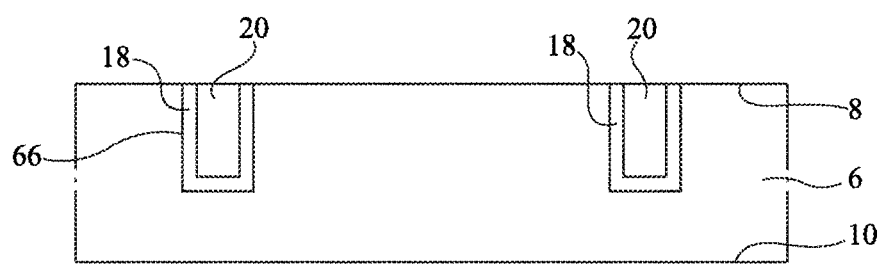

FIG. 9E shows the structure obtained after having removed the portions of insulating layer 68 and the portions of layer 70 of filling material present on substrate 6 outside of openings 66 to delimit, for each trench, insulating layer 18 and core 20. This may be achieved by an etching or by a chem.-mech. polishing method. A subsequent step of thinning substrate 6 may be carried out on the side of face 10, for example, to reach openings 66 so that the obtained insulating trenches extend across the entire thickness of the thinned substrate.

Examples of application of the previously-described electric insulation trenches concern optoelectronic devices, particularly display screens or projection devices, comprising light-emitting diodes formed from three-dimensional semiconductor elements, for example, microwires, nanowires, conical elements, or tapered elements. An embodiment will be described for light-emitting diodes formed from microwires or nanowires. However, such an embodiment may be implemented for three-dimensional elements other than microwires or nanowires, for example, pyramid-shaped three-dimensional elements. Further, an embodiment will be described for light-emitting diodes, each comprising a shell which at least partially surrounds the microwire or the nanowire. However, these embodiments may be implemented for light-emitting diodes for which the active area is located along the height or at the top of the microwire or of the nanowire.

Term "microwire" or "nanowire" designates a three-dimensional structure having a shape elongated in a preferred direction, having at least two dimensions, called minor dimensions, in the range from 5 nm to 2.5 µm, preferably from 50 nm to 2.5 µm, the third dimension, called major dimension, being at least equal to 1 time, preferably at least 5 times, and more preferably still at least 10 times, the largest dimension of the minor dimensions. In certain embodiments, the minor dimensions may be smaller than or equal to approximately 1 µm, preferably in the range from 100 nm to 1 µm, more preferably from 100 nm to 300 nm. In certain embodiments, the height of each microwire or nanowire may be greater than or equal to 500 nm, preferably in the range from 1 µm to 50 µm.

In the following description, term "wire" is used to mean "microwire" or "nanowire" Preferably, the median line of the wire which runs through the centers of gravity of the cross-sections, in planes perpendicular to the preferred direction of the wire, is substantially rectilinear and is called "axis" of the wire hereafter.

Figure 10A:
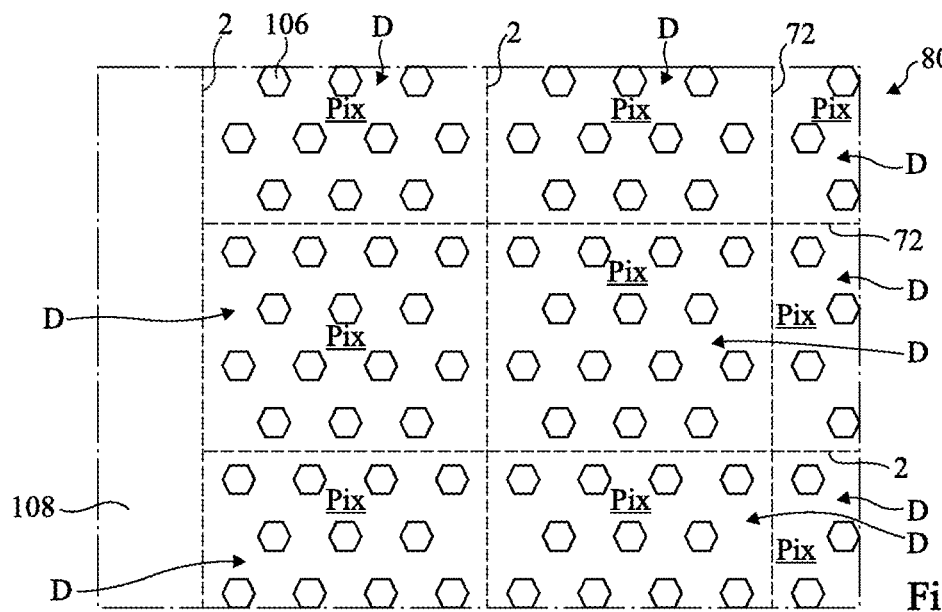
FIGS. 10A, 10B, and 10C are respectively a top view, a front cross-section view, and a bottom view, partial and simplified, of an embodiment of an optoelectronic device comprising light-emitting diodes.
Figure 10B:
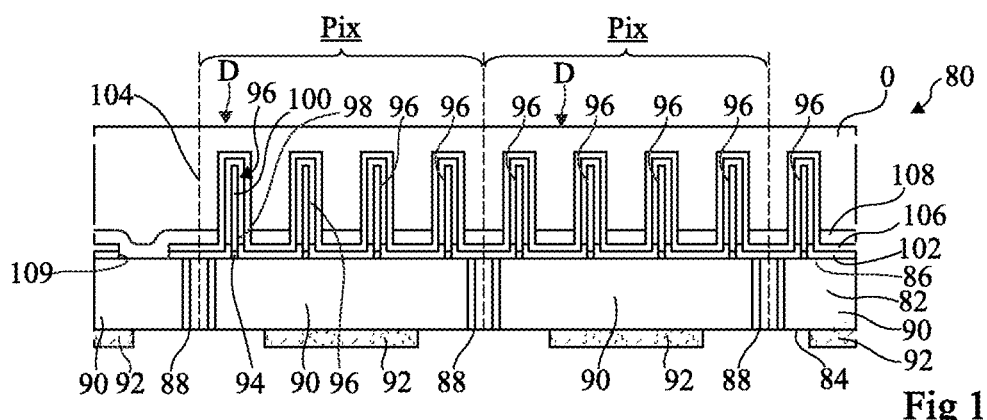
Figure 10C:
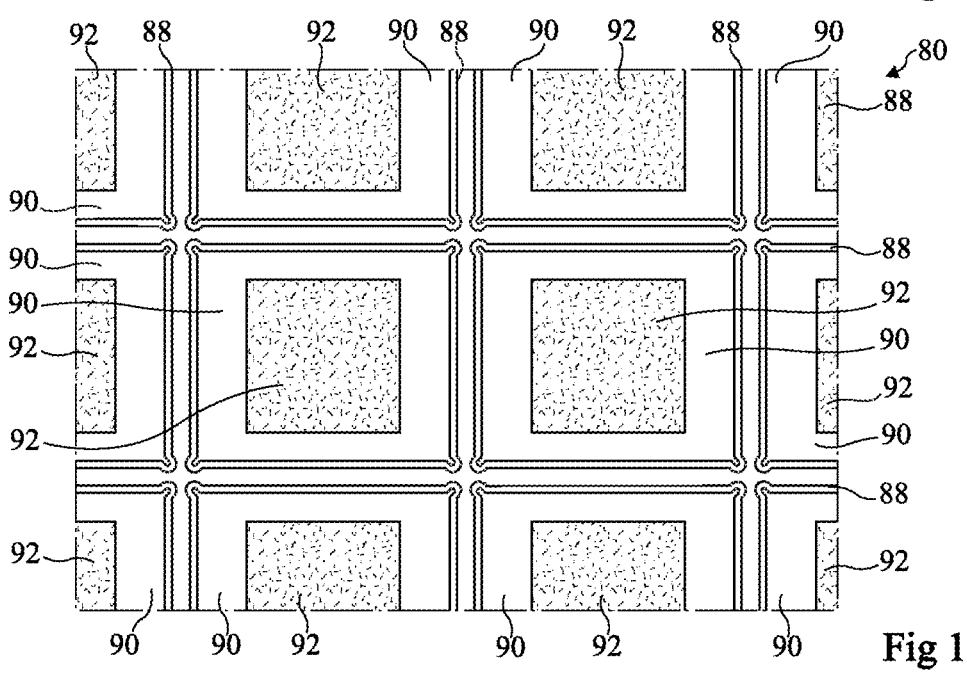

FIGS. 10A to 10C show an embodiment of an optoelectronic device 80, particularly a display screen or a projection device, comprising electric insulation trenches such as shown in FIG. 4 or 8.

Optoelectronic device 80 comprises:
- a conductive or semiconductor substrate 82 comprising a lower face 84 and an opposite upper face 86, upper face 86 being preferably planar at least at the level of the assemblies of light-emitting diodes;
- electric insulation trenches 88, having the structure shown in FIG. 4 or 8, which extend in substrate 82 between faces 84 and 86 and which divide substrate 82 into conductive or semiconductor portions 90;
- conductive pads 92 in contact with lower face 84, each portion 90 being in contact with one of conductive pads 92;
- seed pads 94 favoring the growth of wires, each seed pad 94 being in contact with face 86 on one of conductive or semiconductor portions 90;
- wires 96, each wire 96 being in contact with one of seed pads 94, each wire 96 comprising a lower portion 98, in contact with seed pad 94 and an upper portion 100, continuing lower portion 98;
- an electrically-insulating layer 102 extending on face 86 of substrate 82 and extending on the lateral sides of lower portion 98 of each wire 96;
- a shell 104 comprising a stack of semiconductor layers covering upper portion 100 of each wire 96;
- an electrically conductive and at least partially transparent layer 106 forming an electrode covering each shell 104, and extending on insulating layer 102 between wires 96;
- an electrically conductive layer 108 covering electrode layer 106 between wires 96 but which does not extend on wires 96, conductive layer 108 being further in contact with one of semiconductor portions 90 through an opening 109 provided in electrode layer 106 and in insulating layer 102; and
- a transparent encapsulation layer 110 covering the entire structure.

Optoelectronic device 80 may further comprise a phosphor layer, not shown, and/or colored filters, not shown, inside of encapsulation layer 110 or on top of encapsulation layer 110. According to an embodiment, phosphors are in particular distributed between wires 96.

Each wire 96 and the associated shell 104 form an elementary light-emitting diode. The elementary light-emitting diodes located on a same semiconductor portion 90 form an assembly D of light-emitting diodes. Each assembly D thus comprises a plurality of elementary light-emitting diodes connected in parallel. The number of elementary light-emitting diodes per assembly D may vary from 1 to several thousands, typically from 25 to 100. The number of elementary light-emitting diodes per assembly D may vary from one assembly to the other.

Each display sub-pixel Pix of optoelectronic device 80 comprises one of conductive or semiconductor portions 90 and assembly D of light-emitting diodes resting on portion 90. In FIG. 10A, the separation between display sub-pixels Pix has been schematically shown in dotted lines 112. According to an embodiment, the surface area occupied by each sub-pixel Pix in top view may vary from 3 µm by 3 µm to several mm2 and typically from 10 to 100 µm2.

Each elementary light-emitting diode is formed of a shell at least partially covering a wire. The developed surface area of the elementary light-emitting diodes of an assembly D is greater than the surface area of the display sub-pixel comprising assembly D. The maximum light intensity capable of being supplied by the display sub-pixel may thus be greater than that of a display sub-pixel formed with a two-dimensional inorganic light-emitting diode technology.

Wires 96 are at least partly made of at least one semiconductor material. The semiconductor material may be silicon, germanium, silicon carbide, a III-V compound, a II-VI compound, or a combination of these compounds.

Wires 96 may be at least partly made of semiconductor materials mainly comprising a III-V compound, for example, III-N compounds. Examples of group-III elements comprise gallium (Ga), indium (In), or aluminum (Al). Examples of III-N compounds are GaN, AlN, InN, InGaN, AlGaN, or AlInGaN. Other group-V elements may also be used, for example, phosphorus or arsenic. Generally, the elements in the III-V compound may be combined with different molar fractions.

Wires 96 may be at least partly formed based on semiconductor materials mainly comprising a II-VI compound. Examples of group-II elements comprise group-IIA elements, particularly beryllium (Be) and magnesium (Mg), and group-IIB elements, particularly zinc (Zn) and cadmium (Cd). Examples of group-VI elements comprise group-VIA elements, particularly oxygen (O) and tellurium (Te). Examples of II-VI compounds are ZnO, ZnMgO, CdZnO, or CdZnMgO. Generally, the elements in the II-VI compound may be combined with different molar fractions.

Wires 96 may comprise a dopant. As an example, for III-V compounds, the dopant may be selected from the group comprising a P-type group-II dopant, for example, magnesium (Mg), zinc (Zn), cadmium (Cd), or mercury (Hg), a P-type group-IV dopant, for example, carbon (C), or an N-type group-IV dopant, for example, silicon (Si), germanium (Ge), selenium (Se), sulfur (S), terbium (Tb), or tin (Sn).

The cross-section of wires 96 may have different shapes, such as, for example, an oval, circular, or polygonal shape, particularly triangular, rectangular, square, or hexagonal. As an example, in FIG. 10A, the wires are shown with a hexagonal cross-section. It should thus be understood that term "diameter" or "average diameter" in a cross-section of a wire or of a layer deposited on this wire designates a quantity associated with the surface of the targeted structure in this cross-section, for example corresponding to the diameter of the disk having the same surface area as the cross-section of the wire. The average diameter of each wire 96 may be in the range from 50 nm to 5 µm. The height of each wire 96 may be in the range from 250 nm to 50 µm. Each wire 96 may have a semiconductor structure elongated along an axis substantially perpendicular to face 86. Each wire 96 may have a generally cylindrical shape. The axes of two adjacent wires 96 may be distant by from 0.5 µm to 10 µm and preferably from 1.5 µm to 5 µm. As an example, wires 96 may be regularly distributed, particularly in a hexagonal network.

As an example, lower portion 98 of each wire 96 is mainly made of the III-N compound, for example, doped gallium nitride of the same type as substrate 82, for example, of type N, for example, silicon-doped. Lower portion 98 extends along a height which may be in the range from 100 nm to 25 µm.

As an example, upper portion 100 of each wire 96 is at least partially made of a III-N compound, for example, GaN. Upper portion 100 may be N-type doped, possibly less heavily doped than lower portion 98, or may not be intentionally doped. Upper portion 100 extends along a height which may be in the range from 100 nm to 25 µm.

Shell 104 may comprise a stack of a plurality of layers especially comprising:
an active layer covering upper portion 100 of the associated wire 96;
an intermediate layer having a conductivity type opposite to that of lower portion 98 and covering the active layer; and
a bonding layer covering the intermediate layer and covered with electrode 106.

The active layer is the layer from which most of the radiation supplied by the elementary light-emitting diode is emitted. According to an example, the active layer may comprise means for confining the electric charge carriers, such as multiple quantum wells. It is for example formed of an alternation of GaN and InGaN layers having respective thicknesses from 5 to 20 nm (for example, 8 nm) and from 1 to 15 nm (for example, 2.5 nm). The GaN layers may be doped, for example, of type N or P. According to another example, the active layer may comprise a single InGaN layer, for example having a thickness greater than 10 nm.

The intermediate layer, for example, P-type doped, may correspond to a semiconductor layer or to a stack of semiconductor layers and enables to form a P-N or P-I-N junction, the active layer being located between the intermediate P-type layer and upper N-type portion 100 of the P-N or P-I-N junction.

The bonding layer may correspond to a semiconductor layer or to a stack of semiconductor layers and enables to form an ohmic contact between the intermediate layer and electrode 106. As an example, the bonding layer may be very heavily doped with the type opposite to that of lower portion 98 of each wire 96, until degeneration of the semiconductor layer(s), for example, P-type doped with a concentration greater than or equal to 1020 atoms/cm3.

The stack of semiconductor layers may comprise an electron barrier layer formed of a ternary alloy, for example, of aluminum gallium nitride (AlGaN) or of aluminum indium nitride (AlInN) in contact with the active layer and the intermediate layer, to ensure a good electric carrier distribution in the active layer.

Electrode 106 is capable of biasing the active layer of each wire 96 and of letting through the electromagnetic radiation emitted by the light-emitting diodes. The material forming electrode 106 may be a transparent conductive material such as indium tin oxide (or ITO), aluminum zinc oxide, gallium zinc oxide or indium zinc oxide, or graphene. As an example, electrode layer 106 has a thickness in the range from 5 nm to 200 nm, preferably from 20 nm to 50 nm.

Conductive layer 108 preferably corresponds to a metal layer, for example, made of aluminum, of copper, of gold, of ruthenium, or of silver, or to a stack of metal layers, for example, made of titanium-aluminum, of silicon-aluminum, of titanium-nickel-silver, of copper, or of zinc. As an example, conductive layer 108 has a thickness in the range from 20 nm to 1,500 nm, preferably from 400 nm to 800 nm. Conductive layer 68 is only present between the wires and does not cover the emissive surface thereof. Conductive layer 108 enables to decrease resistive losses during the flowing of current. It also has a reflector function to reflect towards the outside the rays emitted by the light-emitting diodes towards the substrate.

Encapsulation layer 110 is made of an at least partially transparent insulating material. The minimum thickness of encapsulation layer 110 is in the range from 250 nm to 50 µm so that encapsulation layer 110 totally covers electrode 106 at the top of light-emitting diodes assemblies D. Encapsulation layer 110 may be made of an at least partially transparent inorganic material. As an example, the inorganic material is selected from the group comprising silicon oxides of SiOx, where x is a real number between 1 and 2 or SiOyNz, where y and z are real numbers between 0 and 1, and aluminum oxides, for example, Al2O3. Encapsulation layer 110 may be made of an at least partially transparent organic material. As an example, encapsulation layer 110 is a silicone polymer, an epoxide polymer, an acrylic polymer, or a polycarbonate.

An embodiment of the method of manufacturing optoelectronic device 80 is described in French patent application FR14/63420.

Specific embodiments have been described. Various alterations, modifications, and improvements will readily occur to those skilled in the art. In particular, although, in the previously-described embodiments, trenches 12 are shown perpendicular to trenches 14, it should be clear that the trenches may have a different direction. As an example, portions 16 may have, in top view, a hexagonal cross-section.

The invention claimed is:

1. An electronic circuit comprising a semiconductor or conductive substrate having first and second opposite faces and at least first and second electric insulation trenches, not parallel, comprising walls, extending in the substrate from the first face, delimiting at least a portion of the substrate and joining at a junction, the portion of the substrate comprising a protrusion penetrating into the junction, wherein the first trench comprises, on the side of said portion, a first planar wall and wherein the second trench comprises, on the side of said portion, a second planar wall, the first planar wall being coupled to the second planar wall by a connection surface successively comprising, from the first wall to the second wall, a first curved surface delimiting a portion of convex volume of the first trench, a second curved surface delimiting a portion of concave volume of the junction, and a third curved surface delimiting a portion of convex volume of the second trench, and wherein the first, second, and third surfaces-correspond, in a plane parallel to the first face, respectively to first, second, and third arcs of a circle.

2. The electronic circuit of claim 1, wherein the radius of curvature of the second surface is in the range from 200 nm to 2 µm.

3. The electronic circuit of claim 1, wherein the center of the first arc of a circle is located in the first trench, wherein the center of the second arc of a circle is located in the portion, and wherein the center of the third arc of a circle is located in the second trench.

4. The electronic circuit of claim 1, wherein said junction corresponds to an intersection between the first and second trenches, the first trench having a cross-section of decreased width on either side of the intersection and the second trench having a cross-section of decreased width on either side of the intersection.

5. The electronic circuit of claim 4, wherein the connection surface is repeated at the four corners of the intersection.

6. The electronic circuit of claim 1, wherein the walls of the first and second trenches are covered with a layer of a first electrically-insulating material, the core of the first and second trenches being filled with a second material capable of being different from the first material.

7. The electronic circuit of claim 6, wherein the interface between the insulating layer and the core successively comprises fourth, fifth, and sixth surfaces which respectively take the shape of the first, second, and third surfaces.

8. The electronic circuit of claim 7, wherein the radius of curvature of the fourth surface and of the sixth surface is in the range from 100 nm to 1 µm.

* * * * *